(12) United States Patent
Hori et al.

(10) Patent No.: US 11,658,635 B2
(45) Date of Patent: May 23, 2023

(54) JOINED BODY OF PIEZOELECTRIC MATERIAL SUBSTRATE AND SUPPORT SUBSTRATE, AND ACOUSTIC WAVE ELEMENT

(71) Applicant: NGK INSULATORS, LTD., Nagoya (JP)

(72) Inventors: Yuji Hori, Owariasahi (JP); Takahiro Yamadera, Nagoya (JP); Tatsuro Takagaki, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 362 days.

(21) Appl. No.: 16/900,337

(22) Filed: Jun. 12, 2020

(65) Prior Publication Data

US 2020/0313643 A1 Oct. 1, 2020

Related U.S. Application Data

(63) Continuation of application No. PCT/JP2018/042433, filed on Nov. 16, 2018.

(30) Foreign Application Priority Data

Dec. 28, 2017 (JP) .............................. JP2017-252872

(51) Int. Cl.
*H03H 9/02* (2006.01)
*H03H 9/25* (2006.01)
(Continued)

(52) U.S. Cl.
CPC ....... *H03H 9/02574* (2013.01); *H01L 41/312* (2013.01); *H01L 41/337* (2013.01);
(Continued)

(58) Field of Classification Search
CPC .................................. H03H 9/02; H03H 9/25
See application file for complete search history.

(56) References Cited

U.S. PATENT DOCUMENTS 10,049,951 B2 * 8/2018 Konishi ................ H01L 21/762
10,931,256 B2 * 2/2021 Goto .................. H03H 9/02574
(Continued)

FOREIGN PATENT DOCUMENTS

JP 3774782 B2 5/2006
JP 5713025 B2 5/2015
(Continued)

OTHER PUBLICATIONS

International Preliminary Report on Patentability and Written Opinion issued in corresponding International Application No. PCT/JP2018/042433, with English translation, dated Jul. 9, 2020 (16 pages).

(Continued)

*Primary Examiner* — Hafizur Rahman
*Assistant Examiner* — Alan Wong
(74) *Attorney, Agent, or Firm* — Flynn Thiel, P.C.

(57) ABSTRACT

A bonded body includes a supporting substrate, a piezoelectric material substrate of a material selected from the group consisting of lithium niobate, lithium tantalate and lithium niobate-lithium tantalate, and a bonding layer bonding the supporting substrate and piezoelectric material substrate. A material of the bonding layer is silicon oxide. Provided that the bonding layer is divided into a piezoelectric material substrate-side bonding part and a supporting substrate-side
(Continued)

bonding part, the piezoelectric material substrate-side bonding part has a nitrogen concentration higher than a nitrogen concentration of the supporting substrate-side bonding part.

5 Claims, 6 Drawing Sheets

(51) Int. Cl.
*H01L 41/312* (2013.01)
*H01L 41/337* (2013.01)
*H03H 3/08* (2006.01)

(52) U.S. Cl.
CPC .......... *H03H 3/08* (2013.01); *H03H 9/02559* (2013.01); *H03H 9/25* (2013.01)

(56) References Cited

U.S. PATENT DOCUMENTS

| | | |
|---|---|---|
| 2004/0226162 A1 | 11/2004 | Miura et al. |
| 2013/0285768 A1 | 10/2013 | Watanabe et al. |
| 2014/0130319 A1 | 5/2014 | Iwamoto |
| 2017/0077897 A1 | 3/2017 | Otsubo et al. |
| 2018/0175283 A1 | 6/2018 | Akiyama et al. |
| 2019/0036009 A1 | 1/2019 | Tai et al. |

FOREIGN PATENT DOCUMENTS

| | | |
|---|---|---|
| JP | 5910763 B2 | 4/2016 |
| JP | 2016225537 A | 12/2016 |
| WO | 2012043615 A1 | 4/2012 |
| WO | 2015186661 A1 | 12/2015 |
| WO | 2017163722 A1 | 9/2017 |

OTHER PUBLICATIONS

International Search Report with English Translation issued in corresponding International Application No. PCT/JP2018/042433 dated Jan. 29, 2019 (5 pages).

Written Opinion of International Searching Authority issued in corresponding International Application No. PCT/JP2018/042433 dated Jan. 29, 2019 (5 pages).

Yoshikaju Zikuhara et al., Sequential activation process of oxygen RIE and nitrogen radical for LiTaO3 and Si wafer bonding, ECS Transactions, 3 (6) (2006) pp. 91-98.

T. Plach et al., Journal of Applied Physics 113, 094905, Mechanisms for room temperature direct wafer bonding, (2013) (8 pages).

\* cited by examiner

JOINED BODY OF PIEZOELECTRIC MATERIAL SUBSTRATE AND SUPPORT SUBSTRATE, AND ACOUSTIC WAVE ELEMENT

CROSS-REFERENCE TO RELATED APPLICATIONS

This is a continuation of PCT/JP2018/042433, filed Nov. 16, 2018, which claims priority to Japanese Application No. 2017-252872, filed Dec. 28, 2017, the entire contents of which are incorporated herein by reference.

TECHNICAL FIELD

The present invention relates to a bonded body of a piezoelectric material substrate and supporting substrate, and an acoustic wave device.

BACKGROUND ARTS

An SOI substrate composed of a high resistance $Si/SiO_2$ thin film/Si thin film, for realizing a high-performance semiconductor device has been widely used. Plasma activation is used for creating the SOI substrate. This is because the bonding can be achieved at a relatively low temperature (400° C.). A composite substrate composed of similar $Si/SiO_2$ thin film/piezoelectric thin film for improving the characteristics of a piezoelectric device has been proposed (patent document 1). According to patent document 1, the piezoelectric material substrate composed of lithium niobate or lithium tantalate and silicon substrate with a silicon oxide layer formed thereon is activated by an ion activation method, followed by the bonding.

A filter of a multi-layered structure by forming a single or multiple dielectric film at an interface has also been proposed (patent document 2). However, there is little known information relating to bonding techniques for realizing the structure of lithium tantalate/silicon oxide/silicon.

Patent document 3 discloses that lithium tantalate and sapphire or ceramic are bonded through a silicon oxide layer by a plasma activation method.

According to non-patent document 1, lithium tantalate substrate and a silicon substrate with a silicon oxide film provided thereon may be bonded with each other by irradiating $O_2$ RIE plasma (13.56 MHz) and a microwave (2.45 GHz) of $N_2$ in series.

When Si and $SiO_2/Si$ are bonded with each other by plasma activation, a sufficiently high bonding strength is obtained by the formation of a Si—O—Si bond at the interface. Further, at the same time, Si is oxidized to $SiO_2$ so that the flatness is improved and the bonding as described above is facilitated at the uppermost surface (non-patent document 2).

Further, according to a surface acoustic wave device described in patent document 4, a film of a high sound speed and a film of a low sound speed may be provided between a piezoelectric material substrate and a supporting substrate to prevent the leakage of an energy of a surface acoustic wave into a supporting substrate.

RELATED TECHNICAL DOCUMENTS

Non-Patent Documents (Non-Patent Document 1)
ECS Transactions, 3 (6) 91-98 (2006)
(Non-patent document 2)
J. Applied Physics 113, 094905 (2013)

Patent Documents (Patent document 1) Japanese Patent Publication No. 2016-225537A
(Patent document 2) Japanese Patent No. 5910763B
(Patent document 3) Japanese Patent No. 3774782B
(Patent document 4) Japanese Patent No 5713025B

SUMMARY OF THE INVENTION

As described in the prior documents, in the case that a piezoelectric device is produced by thinning a lithium niobate or lithium tantalate substrate by ion injection, the characteristics are low, which is problematic. It is thought that the crystallinity is deteriorated due to damage during the ion injection.

On the other hand, if a piezoelectric material substrate such as lithium niobate or lithium tantalate is bonded to a silicon oxide layer on a silicon substrate and the piezoelectric material substrate is then polished to make the substrate thinner, a processing denatured layer can be removed by CMP so that the device characteristics are not deteriorated. However, as the thickness of the piezoelectric material substrate is made smaller by polishing, the characteristics of the thus obtained bonded body may be deteriorated. Particularly in the case when the bonded body is used as an acoustic wave device, the characteristics of the acoustic wave device, in particular a ratio (admittance ratio) of an admittance at a resonance frequency fs with respect to an admittance at an anti-resonance frequency fr, are reduced.

An object of the present invention is, in bonding a piezoelectric material substrate of a material, selected from the group consisting of lithium niobate, lithium tantalate and lithium-niobate-lithium tantalate, and a supporting substrate with a silicon oxide layer, to improve the performance of a bonded body.

(Solution for the Object)

The present invention provides in one embodiment a bonded body comprising:

a supporting substrate;

a piezoelectric material substrate comprising a material selected from the group consisting of lithium niobate, lithium tantalate and lithium niobate-lithium tantalate; and a bonding layer for bonding the supporting substrate and the piezoelectric material substrate, wherein the bonding layer comprises a material of silicon oxide; and wherein a nitrogen concentration of a piezoelectric material substrate-side bonding part is higher than a nitrogen concentration of a supporting substrate-side bonding part, provided that the bonding layer is divided into the piezoelectric material substrate-side bonding part and the supporting substrate-side bonding part.

The present invention further provides in another embodiment a bonded body comprising:

a supporting substrate;

a piezoelectric material substrate comprising a material selected from the group consisting of lithium niobate, lithium tantalate and lithium niobate-lithium tantalate; and a bonding layer for bonding the supporting substrate and the piezoelectric material substrate, wherein the bonding layer comprises a material of silicon oxide; and wherein a nitrogen concentration of an intermediate part is higher than a nitrogen concentration of a piezoelectric material substrate-side bonding part and a nitrogen concentration of a supporting substrate-side bonding part, provided that the bonding layer is divided into the piezoelectric material substrate-side bonding part, the supporting substrate-side bonding part and the intermediate part between the piezoelectric material substrate-side bonding part and the supporting substrate-side bonding part.

The present invention further provides in another embodiment an acoustic wave device comprising the bonded body and an electrode provided on the piezoelectric material substrate.

EFFECTS OF THE INVENTION

The inventors have researched the reason that the characteristics of the bonded body are deteriorated when the piezoelectric material substrate composed of lithium niobate or the like and the supporting substrate with the silicon oxide layer are directly bonded with each other. Particularly, the reason that a ratio (admittance ratio) of an admittance at a resonance frequency fs with respect to an admittance at an anti-resonance frequency fr is reduced was studied.

In the case in which the bonding layer between the piezoelectric material substrate and supporting substrate is made of silicon oxide, a sound speed of bulk wave propagating in the silicon oxide (bonding layer) is lower than a sound speed of bulk wave propagating in the piezoelectric material substrate (for example lithium niobate or lithium tantalate). It is thus thought that propagating energy is leaked from the piezoelectric material substrate into the supporting substrate through the bonding layer to deteriorate the propagation characteristics.

Here, the inventors came up with the idea of providing a part having a relatively high nitrogen concentration and having a relatively high sound speed on the side of the piezoelectric material substrate of the bonding layer, and providing a part having a relatively low nitrogen concentration and low sound speed on the side of the supporting substrate. As a result, the leakage of an acoustic wave propagating in the piezoelectric material substrate into the supporting substrate can be suppressed.

Further, the inventors came up with the idea of providing a part having a relatively high nitrogen concentration and a relatively high sound speed in the intermediate part of the bonding layer and of providing parts each having a relatively low nitrogen concentration and low sound speed on the sides of the supporting substrate and the piezoelectric material substrate. The leakage of the acoustic wave propagating in the piezoelectric material substrate into the supporting substrate is suppressed to provide a device of a low loss.

Further, according to a surface acoustic wave device described in patent document 4, a high sound speed film and low sound speed film may be provided between a piezoelectric material substrate and supporting substrate to prevent the leakage of energy of the surface acoustic wave into the supporting substrate. Further, silicon nitride is preferably used as the high sound speed film and silicon oxide is preferably used as the low sound speed film. It is, however, not disclosed that the layered part has a relatively high nitrogen concentration, as described above, in the bonding layer of a material of silicon oxide between the piezoelectric material substrate and supporting substrate to suppress the leakage of the energy of the acoustic wave propagating in the piezoelectric material substrate.

It has further been found that it is possible to generate a region having a higher nitrogen concentration in a part of the bonding layer composed of a material of silicon oxide on the side of the piezoelectric material substrate, by providing the silicon oxide film on the supporting substrate, by irradiating nitrogen plasma onto the bonding faces of the silicon oxide film and of the piezoelectric material substrate at 150° C. or lower to activate them, and by bonding the bonding face of the piezoelectric material substrate onto the bonding face of the silicon oxide layer.

It has further been found that it is possible to generate a region having a higher nitrogen concentration in the intermediate part of the bonding layer composed of a material of silicon oxide, by providing silicon oxide layers on the supporting substrate and piezoelectric material substrate, respectively, by irradiating nitrogen plasma on the respective bonding faces of the respective silicon oxide layers at a temperature of 150° C. or lower to activate them and by directly bonding the silicon oxide film on the supporting substrate and the silicon oxide film on the piezoelectric material substrate.

EMBODIMENTS FOR CARRYING OUT THE INVENTION

The present invention will be described in detail below, appropriately referring to the drawings.

Figure 1A:
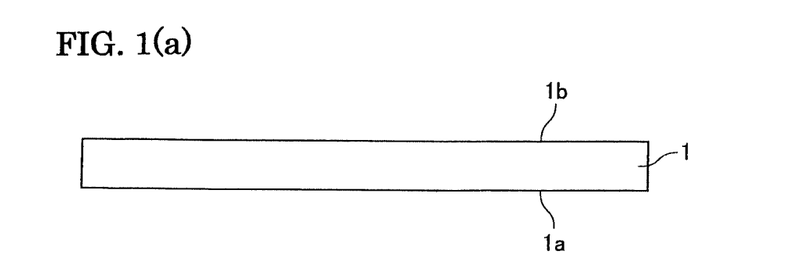
FIG. 1(a) shows a piezoelectric material substrate 1.
Figure 1B:
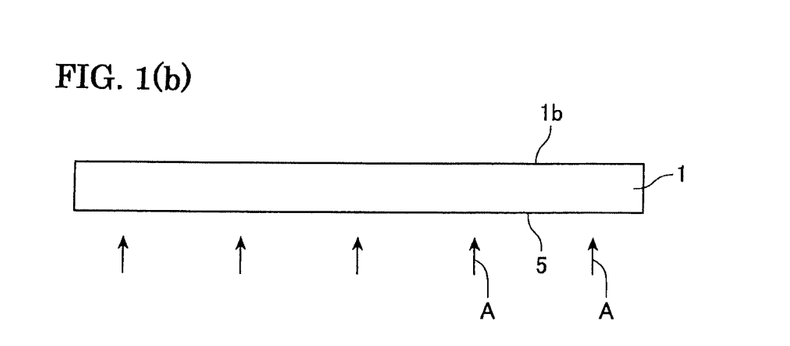
FIG. 1(b) shows the state that plasma is irradiated onto a surface of the piezoelectric material substrate to generate an activated surface.
Figure 2A:
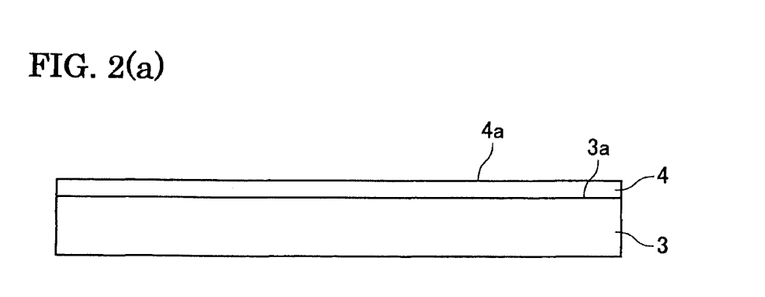
FIG. 2(a) shows the state that a silicon oxide film is provided on a supporting substrate.
Figure 2B:
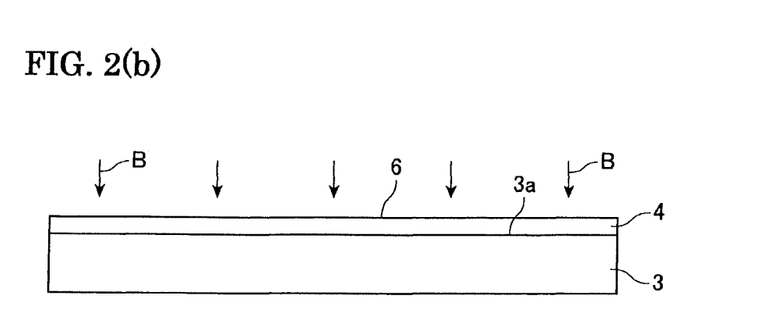
FIG. 2(b) shows the state that plasma is irradiated onto a bonding face of the silicon oxide film.
Figure 3A:
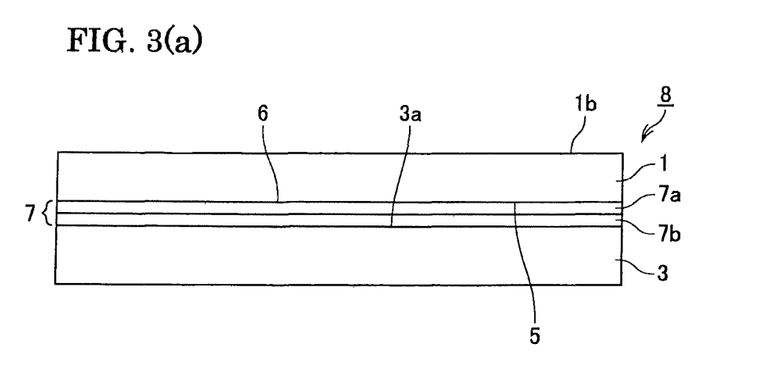
FIG. 3(a) shows a bonded body of the piezoelectric material substrate and supporting substrate.
Figure 3B:
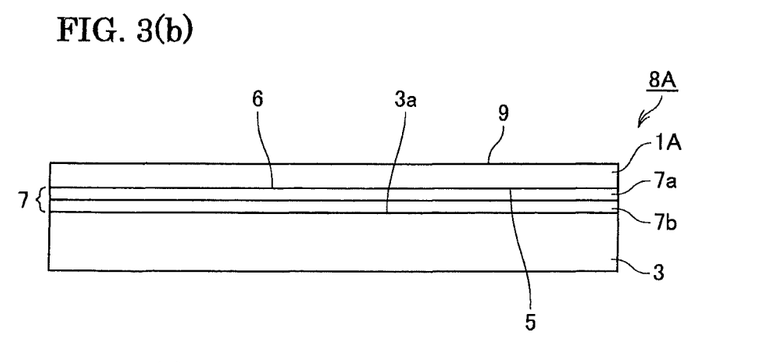
FIG. 3(b) shows the state that the piezoelectric material substrate of a bonded body is thinned by processing.
Figure 3C:
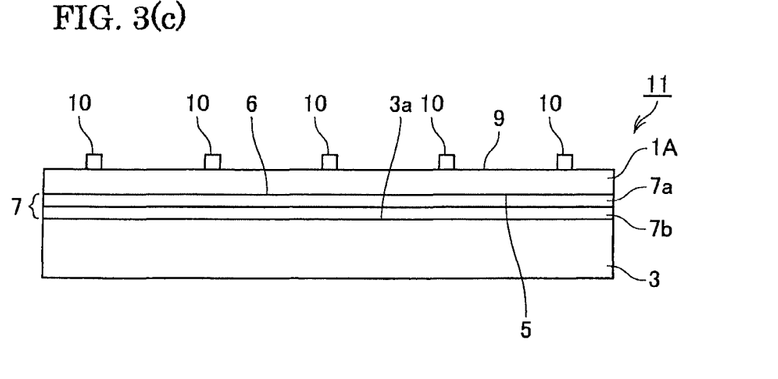
FIG. 3(c) shows an acoustic wave device.

FIGS. 1 to 3 relate to a first embodiment of the present invention.

First, as shown in FIG. 1(a), a piezoelectric material substrate 1 having a pair of main faces 1a and 1b is prepared. Then, as shown in FIG. 1(b), plasma is irradiated onto the bonding face 1a of the piezoelectric material substrate 1 as arrows A to obtain a surface activated bonding face 5.

Further, as shown in FIG. 2(a), a silicon nitride film 4 on a surface 3a of a supporting substrate 3 is formed. Then, as shown in FIG. 2(b), plasma is irradiated onto a surface 4a of the silicon nitride layer 4 as arrows B to perform surface activation to form an activated bonding face 6.

The activated bonding face 5 on the piezoelectric material substrate 1 and activated bonding face 6 of the silicon oxide film 4 on the supporting substrate 3 are contacted and directly bonded with each other to obtain a bonded body 8 shown in FIG. 3(a). Here, a bonding layer 7 made of a material of silicon oxide, between the supporting substrate 3 and piezoelectric material substrate 1 is generated. Provided that the bonding layer 7 is divided into a piezoelectric material substrate-side bonding part 7a and supporting substrate-side bonding part 7b, a nitrogen concentration of the piezoelectric material substrate-side bonding part 7a is made higher than a nitrogen concentration of the supporting substrate-side bonding part 7b. The piezoelectric material substrate-side bonding part 7a contacts the piezoelectric material substrate 1, and the supporting substrate-side bonding part 7b contacts the supporting substrate 3.

An electrode may be provided on the piezoelectric material substrate 1 at this stage. Further, preferably, as shown in FIG. 3(b), the main face 1b of the piezoelectric material substrate 1 is processed to make the substrate 1 thinner, to obtain a thinned piezoelectric material substrate 1A. 9 represents a processed surface. Then, as shown in FIG. 3(c), an electrode 10 may be formed on the processed surface 9 of the piezoelectric material substrate 1A of the bonded body 8A to obtain a piezoelectric material device 11.

According to the present embodiment, the bonding layer 7 is made of silicon oxide, and provided that the bonding layer 7 is divided into the piezoelectric material substrate-side bonding part 7a and the supporting substrate-side bonding part 7b, the nitrogen concentration N7a of the piezoelectric material substrate-side bonding part 7a is higher than the nitrogen concentration N7b of the supporting substrate-side bonding part. A ratio (N7a/N7b) of the nitrogen concentration N7a of the piezoelectric material substrate-side bonding part 7a with respect to the nitrogen concentration N7b of the supporting substrate-side bonding part may preferably be 10 or higher and may more preferably be 100 or higher. Further, from a practical viewpoint, the ratio (N7a/N7b) may preferably be 1000 or lower.

The nitrogen concentration N7a of the piezoelectric material substrate-side bonding part 7a may preferably be 1E19 atoms/cm$^3$ or higher and may more preferably be 5E19 atoms/cm$^3$ or higher. Further, the nitrogen concentration N7a may be 8E20 atoms/cm$^3$ or lower. Further, the nitrogen concentration N7b of the supporting substrate-side bonding part 7b of the bonding layer may preferably be 4E17 to 7E18 atoms/cm$^3$. Besides, "1E19" indicates "1×10$^{19}$" and the other numerical values are interpreted in the same manner.

Additionally, the bonding layer 7 is divided into the two parts in the direction of thickness to provide the piezoelectric material substrate-side bonding part 7a and supporting substrate-side bonding part 7b, provided that the thicknesses of the respective bonding parts are the same. Further, the piezoelectric material substrate-side bonding part 7a contacts the piezoelectric material substrate 1, and the supporting substrate-side bonding part 7b contacts the supporting substrate 3.

According to a preferred embodiment, a carbon concentration C7a of the piezoelectric material substrate-side bonding part 7a is higher than a carbon concentration C7b of the supporting substrate-side bonding part 7b. A ratio (C7a/C7b) of the carbon concentration C7a of the piezoelectric material substrate-side bonding part 7a with respect to the carbon concentration C7b of the supporting substrate-side bonding part may preferably be 10 or higher and more preferably be 100 or higher. Further, from a practical viewpoint, the ratio (C7a/C7b) may preferably be 1000 or lower.

For the present embodiment, the carbon concentration C7a of the piezoelectric material substrate-side bonding part 7a may preferably be 1E19 atoms/cm$^3$ or higher and may more preferably be 5E19 atoms/cm$^3$ or higher. Further, the carbon concentration C7a may be 1E21 atoms/cm$^3$ or lower. Further, the carbon concentration C7b of the supporting substrate-side bonding part 7b of the bonding layer 7 may preferably be 1E17 to 3E18 atoms/cm$^3$.

According to a preferred embodiment, a fluorine concentration F7a of the piezoelectric material substrate-side bonding part 7a is higher than a fluorine concentration F7b of the supporting substrate-side bonding part 7b. A ratio (F7a/F7b) of the fluorine concentration F7a of the piezoelectric material substrate-side bonding part 7a with respect to the fluorine concentration F7b of the supporting substrate-side bonding part 7b may preferably be 5 or higher and may more preferably be 50 or higher. Further, from a practical viewpoint, the ratio (F7a/F7b) may preferably be 500 or lower.

For the present embodiment, the fluorine concentration F7a of the piezoelectric material substrate-side bonding part 7a may preferably be 3E18 atoms/cm$^3$ or higher and may more preferably be 6E18 atoms/cm$^3$ or higher. Further, the fluorine concentration F1a may be 2E20 atoms/cm$^3$ or lower. Further, the fluorine concentration F7b of the supporting substrate-side bonding part 7b of the bonding layer 7 may preferably be 1E17 to 2E18 atoms/cm$^3$.

Figure 4A:
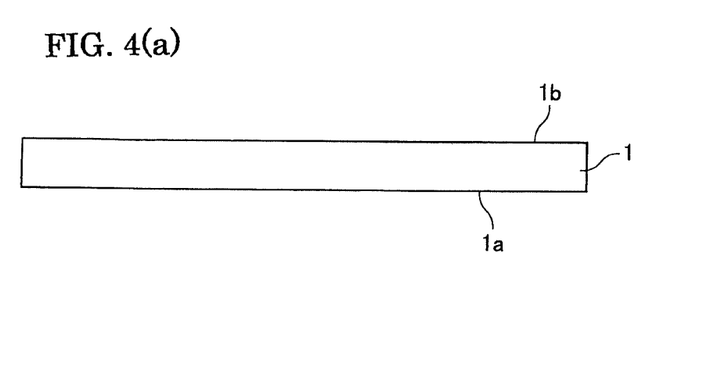
FIG. 4(a) shows the piezoelectric material substrate.
Figure 4B:
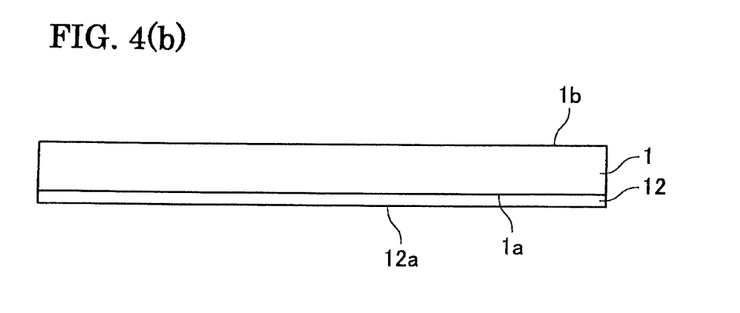
FIG. 4(b) shows the state that a silicon oxide film is provided on the piezoelectric material substrate.
Figure 4C:
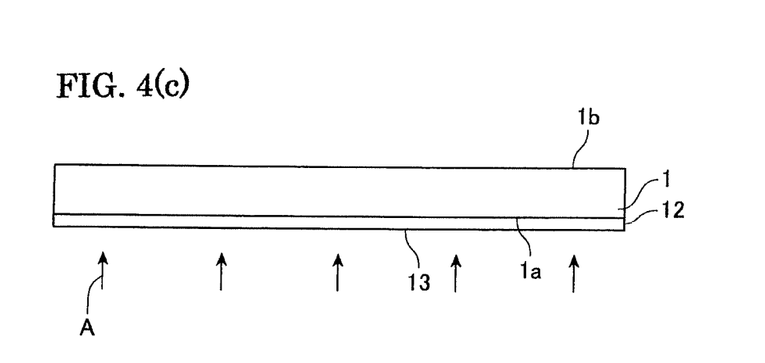
FIG. 4(c) shows the state that plasma is irradiated onto a bonding face of the silicon oxide film to activate it.
Figure 5A:
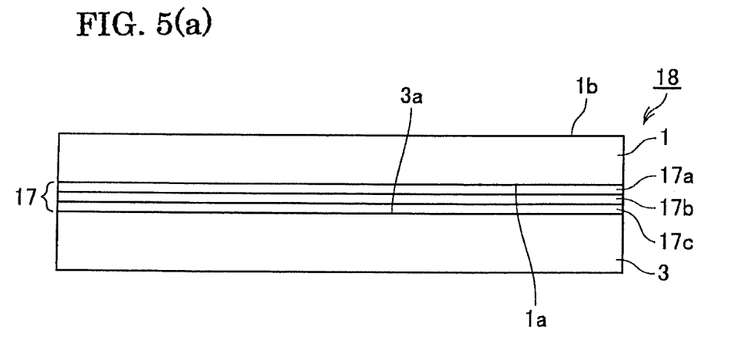
FIG. 5(a) shows a bonded body of the piezoelectric material substrate and supporting substrate.
Figure 5B:
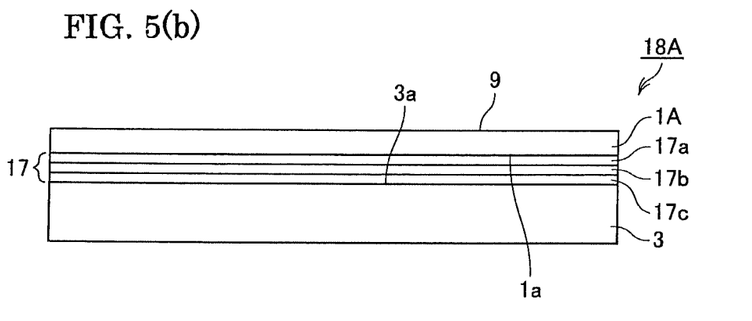
FIG. 5(b) shows the state that the piezoelectric material substrate of a bonded body is thinned by processing.
Figure 5C:
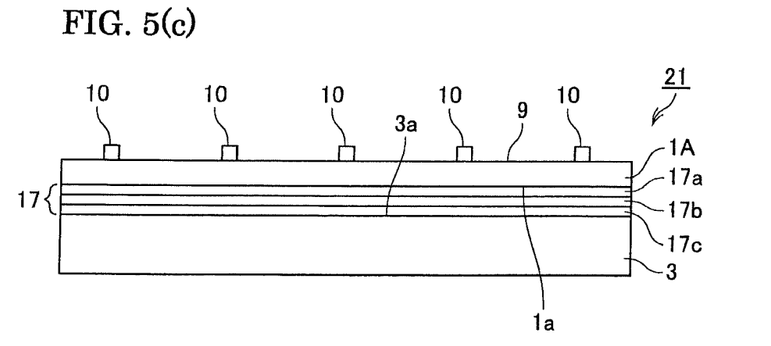
FIG. 5(c) shows an acoustic wave device.

FIGS. 2, 4 and 5 relate to a second embodiment of the present invention.

First, as shown in FIG. 4(a), a piezoelectric material substrate 1 having a pair of main faces 1a and 1b is prepared. Then, as shown in FIG. 4(b), a silicon oxide film 12 is film-formed on the first main face 1a of the piezoelectric material substrate 1. Then, as shown in FIG. 4(c), plasma is irradiated onto a bonding face 12a of the silicon oxide film 12 as arrows A to obtain a surface-activated bonding face 13.

Further, as shown in FIG. 2(a), a silicon oxide film 4 is formed on a surface 3a of a supporting substrate 3. Then, as shown in FIG. 2(b), plasma is irradiated onto a surface 4a of the silicon oxide film 4 as arrows B to perform surface activation, to provide an activated bonding face 6.

Then, an activated bonding face 13 of the silicon oxide layer 12 on the piezoelectric material substrate and the activated bonding face 6 of the silicon oxide film 4 on the supporting substrate are contacted and directly bonded with each other to obtain a bonded body 18 shown in FIG. 5(a). Here, the silicon oxide film 12 and silicon oxide film 4 are integrated through the direct bonding to generate a silicon oxide layer 17.

Provided that the bonding layer 17 is divided into a piezoelectric material substrate-side bonding part 17a, supporting substrate-side bonding part 17c, and intermediate part 17b, a nitrogen concentration of the intermediate part 17b is higher than a nitrogen concentration of the piezoelectric material substrate-side bonding part 17a and a nitrogen concentration of the supporting substrate-side bonding part 17c. The piezoelectric material substrate-side bonding part 17a contacts the piezoelectric material substrate 1, and the supporting substrate-side bonding part 17c contacts the supporting substrate 3.

An electrode may be provided on the piezoelectric material substrate 1 at this stage. Further, preferably, as shown in FIG. 5(b), the main face 1b of the piezoelectric material substrate 1 is processed to make the substrate 1 thinner, to obtain a thinned piezoelectric material substrate 1A. 9 represents a processed surface. Then, as shown in FIG. 5(c), a predetermined electrode 10 may be formed on the processed surface 9 of the piezoelectric material substrate 1A of the bonded body 18A to obtain a piezoelectric material device 21.

According to the present embodiment, the bonding layer 17 is made of a material of silicon oxide, and provided that the bonding layer 17 is divided into the piezoelectric material substrate-side bonding part 17a, intermediate part 17b, and supporting substrate-side bonding part 17c, a nitrogen concentration N17b of the intermediate part 17b is higher than a nitrogen concentration N17a of the piezoelectric material substrate-side bonding part 17a and a nitrogen concentration N17c of the supporting substrate-side bonding part 17c. Ratios (N17b/N17a) and (N17b/N17c) of the nitrogen concentration N17b of the intermediate part 17b with respect to the nitrogen concentration N17a of the piezoelectric material substrate-side bonding part 17a and the nitrogen concentration N17c of the supporting substrate-side bonding part 17c may preferably be 10 or higher and may more preferably be 100 or higher. Further, the ratio (N17b/N17a) and ratio (N17b/N17c) may preferably be 1000 or lower from a practical viewpoint.

Further, the bonding layer 17 is divided, in the direction of thickness, into three parts which are the piezoelectric material substrate-side bonding part 17a, intermediate part 17b, and supporting substrate-side bonding part 17c, and the thicknesses of the respective bonding parts 17a, 17b, and 17c are made the same. Further, the piezoelectric material substrate-side bonding part 17a contacts the piezoelectric material substrate 1A, and the supporting substrate-side bonding part 17c contacts the supporting substrate 3.

The nitrogen concentration N17b of the intermediate part 17b may preferably be 1E19 atoms/$cm^3$ or higher and may more preferably be 5E19 atoms/$cm^3$ or higher. Further, the nitrogen concentration N17b may preferably be 5E20 atoms/$cm^3$ or lower. The nitrogen concentration N17a of the piezoelectric material substrate-side bonding part 17a and the nitrogen concentration N17c of the supporting substrate-side bonding part 17c may preferably be 9E18 atoms/$cm^3$ or lower. Further, the nitrogen concentrations N17a and N17c may preferably be 4E17 atoms/$cm^3$ or higher.

According to the present embodiment, a carbon concentration C17b of the intermediate part 17b is higher than a carbon concentration C17a of the piezoelectric material substrate-side bonding part 17a and higher than a carbon concentration C17c of the supporting substrate-side bonding part 17c. Ratios (C17b/C17a) and (C17b/C17c) of the carbon concentration C17b of the intermediate part with respect to the carbon concentration C17a of the piezoelectric material substrate-side bonding part 17a and the carbon concentration C17c of the of the supporting substrate-side bonding part 17a may preferably be 10 or higher and may more preferably be 100 or higher. Further, the ratio (C17b/C17a) and ratio (C17b/C17c) may preferably be 1000 or lower on a practical viewpoint.

The carbon concentration C17b of the intermediate part 17b may preferably be 1E19 atoms/$cm^3$ or higher and may more preferably be 5E19 atoms/$cm^3$ or higher. Further, the carbon concentration C17b may preferably be 5E20 atoms/$cm^3$ or lower. The carbon concentration C17a of the piezoelectric material substrate-side bonding part 17a and the carbon concentration C17c of the supporting substrate-side bonding part 17c may preferably be 3E18 atoms/$cm^3$ or lower. Further, the carbon concentrations C17a and C17c may be 1E17 atoms/$cm^3$ or higher.

According to the present embodiment, a fluorine concentration F17b of the intermediate part 17b is higher than a fluorine concentration F17a of the piezoelectric material substrate-side bonding part 17a and higher than a fluorine concentration F17c of the supporting substrate-side bonding part 17c. Ratios (F17b/F17a) and (F17b/F17c) of the fluorine concentration F17b of the intermediate part 17b with respect to the fluorine concentration F17a of the piezoelectric material substrate-side bonding part 17a and the fluorine concentration F17c of the supporting substrate-side bonding part 17c may preferably be 5 or higher, and may more preferably 50 or higher. Further, the ratio (F17b/F17a) and ratio (F17b/F17c) may more preferably be 500 or lower from a practical viewpoint.

The fluorine concentration F17b of the intermediate part 17b may preferably be 3E18 atoms/$cm^3$ or higher and may more preferably be 6E18 atoms/$cm^3$ or higher. Further, the fluorine concentration F17b may preferably be 8E19 atoms/$cm^3$ or lower. The fluorine concentration F17a of the piezoelectric material substrate-side bonding part 17a and the fluorine concentration F17c of the supporting substrate-side bonding part 17c may preferably be 2E18 atoms/$cm^3$ or lower. Further, the fluorine concentrations F17a and F17c may be 1E17 atoms/$cm^3$ or higher.

The respective constituents of the present invention will be described further in detail below.

Although the material of the supporting substrate 3 is not particularly limited, preferably the material is selected from the group consisting of silicon, quartz, sialon, mullite, sapphire and translucent alumina. It is thus possible to further improve the temperature characteristics of frequency of acoustic wave device 11 or 21.

The silicon oxide layers 4 and 12 are formed on the supporting substrate 3 or optionally on the piezoelectric material substrate 1. Although the method of film-forming the silicon oxide layers 4 and 12 is not particularly limited, sputtering, chemical vapor deposition (CVD) and vapor deposition may be used. Preferably, the supporting substrate 3 is a silicon substrate, and in this case, the silicon oxide film 4 can be formed by sputtering of oxygen or ion injection onto the surface of the silicon substrate, or by heating under oxidizing atmosphere.

The thickness of the silicon oxide film 4 or 12 may preferably be 0.05 µm or larger, more preferably be 0.1 µm or larger and particularly preferably be 0.2 µm or larger. Further, the thickness of the silicon oxide film may preferably be 3 µm or smaller, preferably 2.5 µm or smaller and may more preferably be 2.0 µm or smaller.

The piezoelectric material substrate 1 used in the present invention is made of single crystals of a lithium tantalate (LT), lithium niobate (LN) or lithium niobate-lithium tantalate solid solution. As the materials have high propagation speeds of a surface acoustic wave and large electro-mechanical coupling factors, it is preferred for use in a surface acoustic wave device for high frequency and wide-band frequency applications.

Further, the normal direction of the main surface of the piezoelectric single crystal substrate 1 is not limited. For example, in the case that the piezoelectric material substrate 1 is made of LT, it is preferred to use the substrate rotated from Y-axis toward Z-axis by 32 to 50° (180°, 58° to 35°, 180° on Eulerian angle representation) around X-axis, which is a direction of propagation of a surface acoustic wave, because of a low propagation loss. In the case that the piezoelectric material substrate 1 is made of LN, (i) it is preferred to use the substrate rotated from Z-axis toward −Y-axis by 37.8° (0°, 37.8°, 0° on Eulerian angle representation) around X-axis, which is a direction of propagation of a surface acoustic wave, because of a large electro-mechanical coupling factor. Alternatively, (ii) it is preferred to use the substrate rotated from Y-axis toward Z-axis by 40 to 65° (180°, 50 to 25°, 180° on Eulerian angle representation) around X-axis, which is a direction of propagation of a surface acoustic wave, because a high acoustic speed can be obtained. Further, although the size of the piezoelectric material substrate 1 is not particularly limited, for example the diameter may be 100 to 200 mm and thickness may be 0.15 to 1 μm.

Plasma is then irradiated onto the bonding face 1a of the piezoelectric material substrate 1, the bonding face 12a of the silicon oxide film 12 on the piezoelectric material substrate 1 or bonding face 4a of the silicon oxide film 4 on the supporting substrate 3 at a temperature of 150° C. or lower to activate the bonding face 1a, 4a or 12a. Although it is preferred to irradiate nitrogen plasma, the bonded bodies 8A and 18A of the present invention can be obtained even when oxygen plasma is irradiated.

The pressure during the surface activation may preferably be 100 Pa or lower and may more preferably be 80 Pa or lower. Further, the atmosphere may be composed of nitrogen only, oxygen only, or a mixture of nitrogen and oxygen.

The temperature during the irradiation of the plasma is preferably 150° C. or lower. It is thereby possible to obtain the bonded bodies 8 and 18A, each having a high bonding strength and no deterioration of the crystallinity. The temperature during the plasma irradiation is preferably 150° C. or lower and may more preferably be 100° C. or lower.

Further, the energy of the irradiated plasma is preferably 30 to 150 W. Further, a product of the energy of the irradiated plasma and irradiation time period is preferably 0.12 to 1.0 Wh.

The bonding face 5 and bonding face 6 of the substrates after the plasma treatment or the bonding face 13a on bonding face 6 are contacted with each other at a room temperature. Although these may be treated under vacuum, the bonding faces are preferably contacted under atmosphere. It is thus possible to realize a composite substrate maintaining the distribution of nitrogen, carbon and fluorine incorporated into silicon oxide by plasma treatment.

According to a preferred embodiment, the bonding face 1a of the piezoelectric material substrate 1 and the bonding faces 4a and 12a of the silicon oxide layers 4 and 12 are subjected to a flattening process before the plasma treatment. The method of flattening the respective bonding faces 1a, 4a and 12a may include lapping, chemical mechanical polishing (CMP), and the like. Further, the flattened face may preferably have an Ra of 1 nm or lower and may more preferably have an Ra of 0.3 nm or lower.

The bonding face 5 of the piezoelectric material substrate 1 and the bonding face 6 of the silicon oxide film 4 on the supporting substrate 3, or the bonding face 13 of the silicon oxide film 12 on the piezoelectric material substrate 1 and bonding face 6 of the silicon oxide film 4 on the supporting substrate 3 are contacted and bonded with each other. Thereafter, an annealing treatment is preferably performed to improve the bonding strength. The temperature during the annealing temperature may preferably be 100° C. or higher and 300° C. or lower.

The bonded bodies 8A and 18A of the present invention may preferably be applied as acoustic wave devices 11 and 21.

As acoustic wave devices 11 and 21, a surface acoustic wave device, Lamb wave-type device, thin film resonator (FBAR) or the like are known. For example, the surface acoustic wave device is produced by providing input side IDT (Interdigital transducer) electrodes (also referred to as comb electrodes or interdigitated electrodes) for oscillating surface acoustic waves and IDT electrodes on the output side for receiving the surface acoustic wave on the surface of the piezoelectric material substrate. By applying a high frequency signal on the IDT electrodes on the input side, an electric field is generated between the electrodes, so that the surface acoustic wave is oscillated and propagated on the piezoelectric material substrate. Then, the propagated surface acoustic wave is drawn as an electrical signal from the IDT electrodes on the output side provided in the direction of the propagation.

A material forming the electrode 10 of the piezoelectric material substrate 1A may preferably be aluminum, an aluminum alloy, copper or gold, and more preferably be aluminum or an aluminum alloy. The aluminum alloy may preferably be Al with 0.3 to 5 weight % of Cu mixed therein. Ti, Mg, Ni, Mo or Ta may be used instead of Cu.

EXAMPLES

Inventive Example A1

An acoustic wave device 11 shown in FIG. 3(c), according to the method described referring to FIGS. 1 to 3, was produced.

Specifically, a 42Y-cut X-propagation LiTaO$_3$ substrate (piezoelectric material substrate) 1 having a thickness of 200 μm and both main faces polished into mirror surfaces and a high-resistance (>2 kΩ·cm) Si (100) substrate (supporting substrate) 3 having a thickness of 675 μm were proposed. Both substrates have sizes of 150 mm. A silicon oxide layer 4 was film-formed by sputtering into a thickness of 500 nm on the supporting substrate 4. As the silicon oxide layer 4 after the film-formation had a surface roughness Ra of 0.6 nm, the surface was slightly polished by CMP (Chemical mechanical polishing) so that the Ra was improved to 0.3 nm.

The bonding face 1a of the piezoelectric material substrate 1 and the bonding face 4a of the silicon oxide layer 4 on the supporting substrate 3 were both subjected to cleaning and surface activation. Specifically, ultrasonic cleaning using pure water was performed, and the substrate surfaces were dried by spin dry. The supporting substrate 3 after the cleaning was then introduced into a plasma activation chamber, and the bonding face 4a was activated by nitrogen gas plasma at 30° C. Further, the piezoelectric material substrate 1 was similarly introduced into the plasma activation chamber, and the bonding face 1a was subjected to surface activation by nitrogen gas plasma at 30° C. The time period of the surface activation was 40 seconds and the energy was 100 W. The ultrasonic cleaning and spin dry as described above were performed again for removing particles adhered during the surface activation.

Then, the positioning of the respective substrates was performed, and the bonding faces 5 and 6 of the substrates were contacted with each other at room temperature. The substrates were contacted with the piezoelectric material substrate 1 positioned as the upper side. As a result, it was observed that by a so-called bonding wave that the adhesion of the substrates was spreading, indicating that good preliminary bonding was completed. Then, the bonded body was inserted into an oven filled with nitrogen atmosphere and held at 120° C. for 10 hours, for improving the bonding strength.

The surface 1b of the piezoelectric material substrate 1 of the bonded body 8 after the heating was subjected to grinding, lapping and CMP polishing so that the thickness of the piezoelectric material substrate 1A was 16, 8, 4, 2 or 1

μm. The nitrogen concentrations, carbon concentrations and fluorine concentrations at the respective parts were measured using SIMS method (secondary ion mass spectroscopy) for the thus obtained bonded bodies 8A. As the SIMS measuring system, the "CAMECA IMS-7f" was used, Cs+ was used as primary ion specie, and the primary acceleration voltage was 15.0 kV. The detection region was 30 μmφ.

Figure 6:
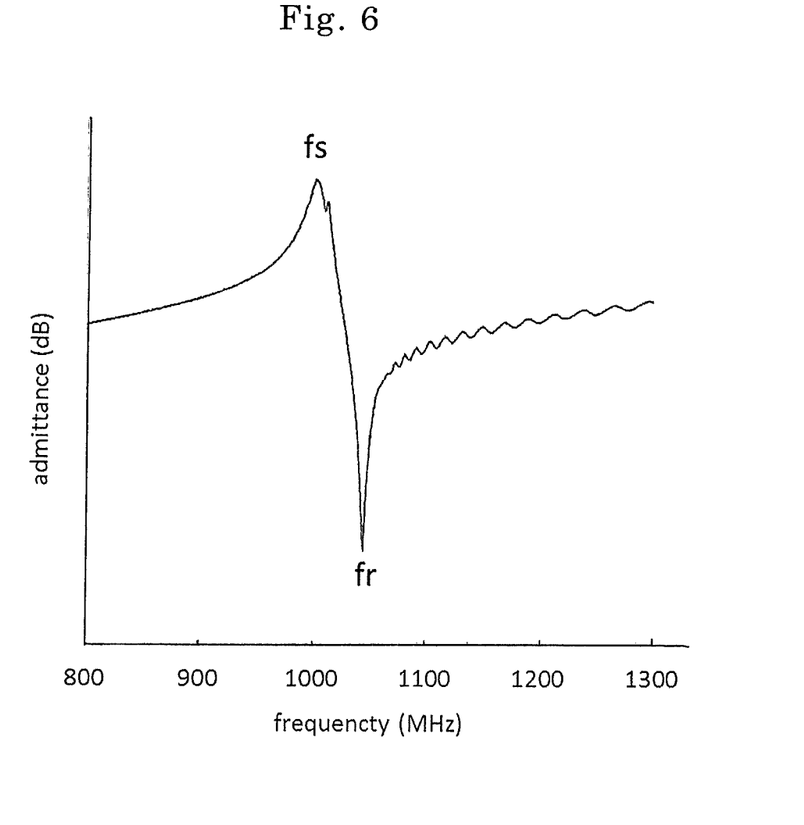
FIG. 6 is a graph showing typical resonance characteristics of an acoustic wave device.

The thickness of the piezoelectric material substrate 1A was measured by an optical measurement system ("F20" supplied by Filmetrix Corporation) applying optical interference. An IDT electrode 10 made of aluminum metal was provided on the surface 9 of the polished piezoelectric material substrate 1A by a photolithography process. The period A of the electrode was 4 μm, so the oscillation frequency was about 1000 MHz. The thickness of the IDT electrode 10 was 200 nm and 80 pairs of reflectors on both sides of the 200 pairs of IDT electrodes 8, respectively, were provided to produce an acoustic wave device 11 (SAW resonator) of 1 port. The impedance characteristics of the thus produced acoustic wave device (SAW resonator) 11 was measured by a network analyzer "E5071C" supplied by Agilent Corporation. FIG. 6 shows typical resonance characteristics. A resonance peak at about 1000 MHz (fs) and an anti-resonance peak at about 1050 MHz (fr) were observed. The ratio of the admittance value at the resonance frequency fs with respect to the admittance value at the anti-resonance frequency fr was measured. The results are shown in Table 3.

Inventive Example A2

In the inventive example A1, plasma of mixed gases of 80 percent nitrogen gas and 20 percent oxygen gas was used instead of nitrogen plasma. When the gas composition was changed, the matching was appropriately changed so that the reflection electric power took the minimum value. The other conditions were the same as those in inventive example A1.

According to the same procedures as the inventive example A1, nitrogen concentrations, carbon concentrations and fluorine concentrations at the respective parts in the thus obtained bonded body 8 were measured and the measurement results are shown in Table 1. Further, as with inventive example A1, the piezoelectric material substrate was processed so that the thickness of the piezoelectric material substrate 1A was 16, 8, 4, 2 or 1 μm. The ratio of the admittance value at the resonance frequency fs with respect to the admittance value at the anti-resonance frequency fr was measured. The results are shown in Table 3.

Comparative Example A1

Each bonded body and SAW device were produced and subjected to the same measurements as inventive example A1. However, the silicon oxide film was film-formed on the piezoelectric material substrate 1 and not film-formed on the side of the supporting substrate 3. Further, the surface activation of the silicon oxide film and supporting substrate 3 was performed, and the activated surfaces of the silicon oxide film and supporting substrate 3 were directly bonded by irradiating nitrogen plasma.

The nitrogen concentrations, carbon concentrations and fluorine concentrations at the respective parts were measured for the thus obtained bonded bodies, and the measurement results are shown in Table 2. The piezoelectric material substrate 1 was processed so that the thickness of the piezoelectric material substrate was 16, 8, 4, 2 or 1 μm according to the procedure of inventive example A1, and the ratio of the admittance value at the resonance frequency fs with respect to the admittance value at the anti-resonance frequency fs was measured. The results are shown in Table 3.

TABLE 1

| | Measurement points | Nitrogen concentration atoms/cm$^3$ | Carbon concentration atoms/cm$^3$ | Fluorine concentration atoms/cm$^3$ |
|---|---|---|---|---|
| Inventive Example A1 | Average value of piezoelectric material substrate-side bonding part | 7.1E19 | 2.6E20 | 4.4E19 |
| | Average value of supporting substrate side bonding part | 4.6E18 | 3.2E17 | 9.7E17 |
| Inventive Example A2 | Average value of piezoelectric material suhstrate-side bonding part | 3.2E19 | 2.1E20 | 9.9E19 |
| | Average value of supporting substrate-side bonding part | 1.8E18 | 1.6E17 | 3.4E17 |

TABLE 2

| | Measurement points | Nitrogen concentration atoms/cm$^3$ | Carbon concentration atoms/cm$^3$ | Fluorine concentration atoms/cm$^3$ |
|---|---|---|---|---|
| Comparative Example A1 | Average value of piezoelectric material substrate-side bonding part | 1.6E18 | 8.1E17 | 2.3E17 |
| | Average value of supporting substrate-side bonding part | 8.3E19 | 1.2E20 | 8.8E18 |

TABLE 3

| | Ratio of admittance value (dB) | | |
|---|---|---|---|
| Thickness of piezoelectric material substrate after processing (μm) | Inventive Example A1 | Inventive Example A2 | Comparative Example A1 |
| 16.0 | 42.5 | 44.0 | 43.3 |
| 8.0 | 40.7 | 42.5 | 42.8 |
| 4.0 | 43.3 | 42.2 | 40.0 |
| 2.0 | 44.3 | 45.1 | 39.3 |
| 1.0 | 46.5 | 44.9 | 35.8 |

As shown in Table 3, even in the case in which the piezoelectric material substrate 1A is extremely thinned by processing to a thickness of 2.0 to 1.0 μm in an acoustic wave device (SAW device) 11 using the bonded body 8A of the present invention, the ratio of the admittance value at the resonance frequency fs with respect to the admittance value at the anti-resonance frequency fr was not deteriorated and was good. On the other hand, according to the bonded body of the comparative example A1, as the thickness of the piezoelectric material substrate decreases, the ratio of the admittance valuer at the resonance frequency fs with respect to the admittance value at the anti-resonance frequency fr deteriorated. In particular, according to the bonded body of the comparative example A1, when the piezoelectric material substrate was processed to a thickness of 4.0 μm or smaller, the ratio of the admittance value at the resonance frequency fs with respect to the admittance value at the anti-resonance frequency fr was considerably deteriorated.

Inventive Example B

In the inventive example A1, the material of the piezoelectric material substrate was changed to a 128Y-cut X-propagation lithium niobate. As a result, the same results as those of the inventive example A1 were obtained.

Inventive Example C1

An acoustic wave device 21 shown in FIG. 5(c), according to the method illustrated referring to FIGS. 2, 4 and 5, was produced.

Specifically, a 42Y-cut X-propagation LiTaO$_3$ substrate (piezoelectric material substrate) 1 having a thickness of 200 μm and both main faces polished into mirror surfaces and a high-resistance (>2 kΩ·cm) Si (100) substrate (supporting substrate) 3 having a thickness of 675 μm was prepared. Both substrates have sizes of 150 mm. Silicon oxide films 12 and 4 were film-formed by sputtering in thicknesses of 250 nm on the piezoelectric material substrate 1 and supporting substrate 3, respectively. The respective silicon oxide films 12 and 4 after the film-formation each had a surface roughness Ra of 0.6 nm measured by AFM, and the surface was slightly polished by CMP (Chemical mechanical polishing) so that Ra was improved to 0.3 nm.

The bonding face 12a of the silicon oxide film 12 on the piezoelectric material substrate 1 and the bonding face 4a of the silicon oxide layer 4 on the supporting substrate 3 were then subjected to washing and surface activation. Specifically, ultrasonic cleaning using pure water was performed and the substrate surfaces were dried by spin drying.

The supporting substrate 3, after the cleaning, was then introduced into a plasma activation chamber to activate the bonding face 4a of the silicon oxide film 4 with nitrogen gas plasma at 30° C. Further, the piezoelectric material substrate 1 was similarly introduced into the plasma activation chamber so that the bonding face 12a of the silicon oxide film 12 was subjected to surface activation with nitrogen gas plasma at 30° C. The time period of the surface activation was 40 seconds and the energy was 100 W. The ultrasonic cleaning and spin drying as described above were performed again for removing particles adhered during the surface activation.

Then, the positioning of the respective substrates was performed, and the activated bonding faces 13 and 6 of the substrates were contacted with each other at room temperature. The substrates were contacted with the piezoelectric material substrate 1 positioned as the upper side. As a result, it was observed with the so-called bonding wave that the adhesion of the substrates was spreading, indicating that good preliminary bonding was completed. Then, the bonded body was inserted into an oven filled with nitrogen atmosphere and held at 120° C. for 10 hours, for improving the bonding strength.

The surface of the piezoelectric material substrate 1 of the bonded body 18, after the heating, was subjected to grinding, lapping and CMP processing so that the thickness of the piezoelectric material substrate 1A was 16, 8, 4, 2 or lea m. The nitrogen concentrations, carbon concentrations and fluorine concentrations at the respective parts were measured using SIMS method (secondary ion mass spectroscopy) for the thus obtained bonded bodies 18A. As the SIMS measuring system, "CAMECA IMS-7f" was used, Cs+ was used as primary ion specie, and the primary acceleration voltage was 15.0 kV. The detection region was 30 μmφ. The results are shown in Table 4.

An IDT electrode 10 made of aluminum metal was provided on the processed surface 9 of the polished piezoelectric material substrate 1A, and an acoustic wave device 21 (SAW device) of 1 port by photography process. The period A of the electrode was 4 μm, so that the oscillation frequency was about 1000 MHz. The impedance characteristics of the thus produced acoustic wave device (SAW resonator) 21 was measured by a network analyzer "E5071C" supplied by Agilent corporation. The ratio of the admittance value at the resonance frequency fs with respect to the admittance value at the anti-resonance frequency fr was measured. The results are shown in Table 6.

Inventive Example C2

In inventive example C1, a plasma of mixed gases of 80 percent of nitrogen gas and 20 percent of oxygen gas, instead of nitrogen plasma, was used. The experiment was otherwise performed according to the same procedure as that for inventive example C1.

The nitrogen concentrations, carbon concentrations and fluorine concentrations at the respective parts were measured for the thus obtained bonded body 18A according to the same procedure as inventive example C1, and the measurement results are shown in Table 4. Further, the piezoelectric material substrate 1A was processed to thicknesses of 16, 8, 4, 2 and 1 μm according to the same procedure as that of inventive example C1, and the ratio of the admittance value at the resonance frequency fs with respect to the admittance value at the anti-resonance frequency fs was measured. The results are shown in Table 6.

Comparative Example C1

The respective bonded bodies and acoustic wave devices (SAW devices) were produced according the same procedure as inventive example C1 and subjected to the measurements as those for inventive example C1. However, the silicon oxide film was film-formed on the piezoelectric material substrate and not film-formed on the side of the supporting substrate. Further, the silicon oxide film and supporting substrate were subjected to the surface activation, and the activated surfaces of the silicon oxide film and supporting substrate were directly bonded with each other by irradiation of nitrogen gas plasma.

The nitrogen concentration, carbon concentration and fluorine concentration at the respective parts were measured for the thus obtained bonded body and the measurement results are shown in Table 5. Further, the piezoelectric material substrate 1A was processed to thicknesses of 16, 8, 4, 2, and 1 μm using the same procedure as for inventive example A1, and the ratio of the admittance value at the resonance frequency fs with respect to the admittance value at the anti-resonance frequency fs was measured. The results are shown in Table 6.

TABLE 4

|  | Measurement points | Nitrogen concentration atoms/cm$^3$ | Carbon concentration atoms/cm | Fluorine concentration atoms/cm$^3$ |
|---|---|---|---|---|
| Inventive Example C1 | Average value of piezoelectric material substrate-side bonding part | 1.8E18 | 5.3E17 | 6.3E17 |
|  | Average value of intermediate part | 6.1E19 | 9.9E19 | 3.2E19 |
|  | Average value of supporting substrate-side bonding part | 2.6E18 | 4.1E17 | 9.7E17 |
| Inventive Example C2 | Average value of piezoelectric material substrate-side bonding part | 8.8E17 | 4.9E17 | 2.8E17 |
|  | Average value of intermediate part | 2.9E19 | 1.7E20 | 9.5E18 |
|  | Average value of supporting substrate-side bonding part | 7.6E17 | 2.5E17 | 4.4E17 |

TABLE 5

|  | Measurement points | Nitrogen concentration atoms/cm$^2$ | Carbon concentration atoms/cm$^2$ | Fluorine concentration atoms/cm$^2$ |
|---|---|---|---|---|
| Comparative Example C1 | Average value of piezoelectric material substrate-side bonding part | 1.6E18 | 8.1E17 | 4.3E17 |
|  | Average value of intermediate part | 1.6E18 | 8.1E17 | 6.6E17 |
|  | Average value of supporting substrate-side bonding part | 8.3E19 | 1.2E20 | 1.2E19 |

TABLE 6

| Ratio of admittance values (dB) | | | |
|---|---|---|---|
| Piezoelectric material substrate after processing | Inventive Example C1 | Inventive Example C2 | Comparative Example C1 |
| 16.0 | 43.9 | 41.4 | 43.3 |
| 8.0 | 42.2 | 42.5 | 42.8 |
| 4.0 | 44.8 | 42.1 | 40.0 |
| 2.0 | 46.6 | 43.3 | 39.3 |
| 1.0 | 47.3 | 46.1 | 35.8 |

As shown in Table 6, according to the acoustic wave device (SAW device) 21 using the bonded body 18A of the present invention, even in the case when the thickness of the piezoelectric material substrate 1A was made extremely small such as 2.0 to 1.0 μm by processing, the ratio of the admittance value at the resonance frequency fs with respect to the admittance value at the anti-resonance frequency fr was not deteriorated and was good. On the other hand, according to the bonded body of comparative example C1, as the thickness of the piezoelectric material substrate was thinner, the ratio of the admittance value at the resonance frequency fs with respect to the admittance value at the anti-resonance frequency fs deteriorated. In particular, according to the bonded body of comparative example C1, when the thickness of the piezoelectric material substrate was 4.0 μm or smaller by processing, the ratio of the admittance value at the resonance frequency fs with respect to the admittance value at the anti-resonance frequency fr was considerably deteriorated.

Inventive Example D

The material of the piezoelectric material substrate 1 was changed to lithium niobate in inventive example C1. As a result, similar results as those of the inventive example C1 were obtained.

The invention claimed is:

1. A bonded body comprising:
   a supporting substrate;
   a piezoelectric material substrate comprising a material selected from the group consisting of lithium niobate, lithium tantalate and lithium niobate-lithium tantalate; and
   a bonding layer for bonding said supporting substrate and said piezoelectric material substrate,
   wherein said bonding layer consists essentially of silicon oxide; and
   wherein an intermediate part has a nitrogen concentration of $1\times10^{19}$ atoms/cm$^3$ or higher and $5\times10^{20}$ atoms/cm$^3$ or lower and a piezoelectric material substrate-side bonding part and a supporting substrate-side bonding part have nitrogen concentrations of $4\times10^{17}$ atoms/cm$^3$ or higher and $9\times10^{18}$ atoms/cm$^3$ or lower, provided that said bonding layer is divided into said piezoelectric material substrate-side bonding part, said supporting substrate-side bonding part and said intermediate part between said piezoelectric material substrate-side bonding part and said supporting substrate-side bonding part, and
   wherein said intermediate part has a carbon concentration of $1\times10^{19}$ atoms/cm$^3$ or higher and $5\times10^{20}$ atoms/cm$^3$ or lower and said piezoelectric material substrate-side bonding part and said supporting substrate-side bonding part have carbon concentrations of $1\times10^{17}$ atoms/cm$^3$ or higher and $3\times10^{18}$ atoms/cm$^3$ or lower.

2. The bonded body of claim 1, wherein a fluorine concentration of said intermediate part is higher than a fluorine concentration of said piezoelectric material substrate-side bonding part and a fluorine concentration of said supporting substrate-side bonding part.

3. The bonded body of claim 1, wherein said piezoelectric material substrate has a thickness of 4.0 μm or smaller.

4. A bonded body comprising:
   a supporting substrate;
   a piezoelectric material substrate comprising a material selected from the group consisting of lithium niobate, lithium tantalate and lithium niobate-lithium tantalate; and
   a bonding layer for bonding said supporting substrate and said piezoelectric material substrate,
   wherein said bonding layer consists essentially of silicon oxide; and
   wherein an intermediate part has a nitrogen concentration of $1\times10^{19}$ atoms/cm$^3$ or higher and $5\times10^{20}$ atoms/cm$^3$ or lower and a piezoelectric material substrate-side bonding part and a supporting substrate-side bonding part have nitrogen concentrations of $4\times10^{17}$ atoms/cm$^3$ or higher and $9\times10^{18}$ atoms/cm$^3$ or lower, provided that said bonding layer is divided into said piezoelectric material substrate-side bonding part, said supporting substrate-side bonding part and said intermediate part between said piezoelectric material substrate-side bonding part and said supporting substrate-side bonding part, and wherein said intermediate part has a fluorine concentration of $3\times10^{18}$ atoms/cm$^3$ or higher and $8\times10^{19}$ atoms/cm$^3$ or lower, and said piezoelectric material substrate-side bonding part and said supporting substrate-side bonding part have fluorine concentrations of $1\times10^{18}$ atoms/cm$^3$ or higher and $2\times10^{18}$ atoms/cm$^3$ or lower.

5. The bonded body of claim 4,
wherein said piezoelectric material substrate has a thickness of 4.0 μm or smaller.

* * * * *